United States Patent
Johnson et al.

(10) Patent No.: US 6,844,070 B2
(45) Date of Patent: Jan. 18, 2005

(54) LOW-TEMPERATURE PLASMA DEPOSITED HYDROGENATED AMORPHOUS GERMANIUM CARBON ABRASION-RESISTANT COATINGS

(75) Inventors: James Neil Johnson, Niskayuna, NY (US); Kevin Warner Flanagan, Albany, NY (US); George Theodore Dalakos, Niskayuna, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/232,462

(22) Filed: Aug. 30, 2002

(65) Prior Publication Data

US 2004/0043218 A1 Mar. 4, 2004

(51) Int. Cl.$^7$ ................................. B32B 9/00
(52) U.S. Cl. .................. 428/408; 428/698; 428/336
(58) Field of Search ................ 428/336, 408, 428/698, 704

(56) References Cited

U.S. PATENT DOCUMENTS

| | | | |
|---|---|---|---|
| 4,704,339 A | * | 11/1987 | Green et al. |
| 4,740,442 A | | 4/1988 | Waddel et al. |
| 4,859,536 A | | 8/1989 | Waddel et al. |
| 5,007,689 A | * | 4/1991 | Kelly et al. |
| 5,365,345 A | * | 11/1994 | Propst et al. |
| 5,718,976 A | | 2/1998 | Dorfman et al. |
| 5,723,207 A | | 3/1998 | Lettington et al. |
| 6,086,796 A | | 7/2000 | Brown et al. |

FOREIGN PATENT DOCUMENTS

| | | | |
|---|---|---|---|
| GB | 2280201 | * | 1/1995 |
| JP | 61105551 | * | 5/1986 |
| JP | 01009401 | * | 1/1989 |

OTHER PUBLICATIONS

Klocek, "Window and Dome Technologies and Materials", SPIE–The International Society fop Optical Engineering, vol. 1112, pp. 154–161, (1989).

J.M. Mackowski, et al., "Rain Erosion Behaviour of Germanium Carbide (GeC) Films Grown on ZnS Substrates", SPIE–vol. 1760, Window and Dome Technologies and Materials III, pp. 201–209, (1992).

Klocek, "Window and Dome Technologies and Materials IV", SPIE–vol. 2286, pp. 273–284 (1994).

* cited by examiner

Primary Examiner—Archene Turner
(74) Attorney, Agent, or Firm—Scully, Scott, Murphy and Presser; Timothy D. Stanley, Esq.

(57) ABSTRACT

A method of forming a hydrogenated amorphous germanium carbon (a-GeC$_x$:H) film on a surface of an infrared (IR) transmissive material such as a chalcogenide is provided. The method includes positioning an IR transmissive material in a reactor chamber of a parallel plate plasma reactor and thereafter depositing a hydrogenated amorphous germanium carbon (a-GeC$_x$:H) film on a surface of the IR transmissive material. The depositing is performed at a substrate temperature of about 130° C. or less and in the presence of a plasma which is derived from a gas mixture including a source of germanium, an inert gas, and optionally hydrogen. Optical transmissive components, such as IR sensors and windows, that have improved abrasion-resistance are also provided.

3 Claims, 2 Drawing Sheets

LOW-TEMPERATURE PLASMA DEPOSITED HYDROGENATED AMORPHOUS GERMANIUM CARBON ABRASION-RESISTANT COATINGS

DESCRIPTION

1. Field of the Invention

The present invention relates to an abrasion-resistant coating for temperature sensitive optical transmissive components, and more particularly to a method for forming a hydrogenated amorphous germanium carbon (a-GeC$_x$:H) film on a surface of an infrared (IR) transmissive material using a low-temperature plasma deposition process.

2. Background of the Invention

Various devices including aircraft and guided missiles which travel at high velocities are controlled by transmitting a signal from a remote station to an infrared (IR) sensor or window located on-board the device. While in operation, the IR sensor or window is exposed to considerable heat loading and erosion due to impact of particles. Such exposure oftentimes exceeds the working capabilities of the IR sensor or window. Even the smallest atmospheric dust particles can scratch the IR sensor or window; and over time, cause considerable erosion effects on the optical transmissivity of the IR sensors or windows. The term "optical transmissivity" is used herein to refer to the ability a material has to allow desired wavelengths of radiate energy, or light, to pass through it.

Materials which can be used to make IR sensors or windows include, but are not limited to: zinc sulfide (ZnS), zinc selenide (ZnSe), germanium (Ge), silicon (Si), gallium arsenide (GaAs), gallium phosphide (GaP), fused silica, aluminum oxynitride (AlON), sapphire (Al$_2$O$_3$), magnesium oxide (MgO), spinel (MgO—Al$_2$O$_3$), cubic zirconia (c-ZrO$_2$), lanthana-doped yttria, yttria (Y$_2$O$_3$), mixed fluoride glasses and other optical transmissive materials. These optical transmissive materials are generally temperature sensitive materials (i.e., they have a low softening temperature) that oftentimes fail due to thermal shock caused by atmospheric friction at high velocities. Additionally, optical transmissive materials are generally soft materials and therefore damage easily upon use.

Protective coatings and films are typically applied to protect optical transmissive materials from damage caused by thermal shock and erosion/abrasion. One coating that has been successfully employed in protecting optical transmissive materials is a hard carbon film that has diamond-like properties, e.g., a diamond-like carbon (DLC) film. However, DLC films often require high-temperatures and atomic hydrogen for deposition, both of which can degrade the optical transmissive material unless various interlayers are employed. Unfortunately, suitable interlayers are difficult to find and oftentimes the interlayer delaminates at high-temperatures, further complicating the process.

Furthermore, interlayers and DLC coatings may interfere with the high degree of optical transmissivity often required for such devices. To be useful, any protective coating, or interlayer for use with optical transmissive materials, must itself be highly optically transmissive. The optical transmissivity of the coating or interlayer itself must also be able to withstand high-operating temperatures.

Another known coating material is germanium-carbon. Germanium-carbon is a hard, amorphous material containing Ge, C and H, see, for example, A. H. Lettington, et al., Proc. SPIE 1112, 156–61 (1989), and J. M. Mackowski, et al., Proc. SPIE 1760, 201–9 (1992). Germanium-carbon can be made from GeH$_4$ and C$_4$H$_{10}$ or CH$_4$ by PECVD (at temperatures of about 350° C. or above), or by sputtering a Ge target in a hydrocarbon atmosphere. Because of relatively low intrinsic stress germanium-carbon can be grown in thick layers (>100 microns), but provides only modest rain erosion resistance.

The refractive index of germanium-carbon can be varied between 2 and 4 by changing the Ge:C ratio. The absorption coefficient of coatings deposited using one method was less than 10 cm$^{-1}$ in the 3–12 micron range. A more Ge-rich preparation had an absorption coefficient in the 40–270 cm$^{-1}$ range at 10.6 microns. Young's modulus for germanium-carbon is reported near 300 GPa with a nanoindentation hardness in the 14–20 GPa range. An abrasion-resistant, multilayer, dual-band (3–5 and 8–12 micron) antireflection coating on ZnS is based on several different layers of germanium-carbon.

Although germanium-carbon films are known, such films are typically formed at high-temperatures, which cause the film to delaminate from the IR transmissive material and/or effect the optical transmissivity of the IR transmissive material.

In view of the state of the art mentioned above, there is a need for providing a coating for protecting temperature sensitive optical materials, which is highly resistant to abrasion, yet is capable of being optically transmissive itself. Such an abrasion-resistant coating should be applied in a manner that does not adversely affect the transmissivity of the underlying optical material.

SUMMARY OF THE INVENTION

One aspect of the present invention relates to a method of providing an abrasion-resistant coating to the surface of an IR transmissive material using a low-temperature plasma deposition process. Specifically, the method of the present invention comprises the steps of:

positioning an IR transmissive material in a reactor chamber of a parallel plate plasma reactor; and depositing a hydrogenated amorphous germanium carbon (a-GeC$_x$:H) film on a surface of the IR transmissive material, wherein the depositing is performed at a substrate temperature of about 130° C. or less.

Another aspect of the present invention relates to an optical transmissive component, such as an IR sensor or window, which comprises:

an IR transmissive material; and a hydrogenated amorphous germanium carbon (a-GeC$_x$:H) film located atop a surface of the IR transmissive material, wherein the a-GeC$_x$:H film is IR transmissive and is substantially resistant to abrasion.

In some embodiments of the present invention, the optical transmissive component further includes a DLC coating formed atop the a-GeC$_x$:H film. In such an embodiment, the a-GeC$_x$:H film is used as an interlayer between the DLC coating and the IR transmissive material.

In the above formula, x represents a number from about 10 to about 45, with a number from about 25 to about 30 being more highly preferred.

DETAILED DESCRIPTION OF THE INVENTION

Figure 1:
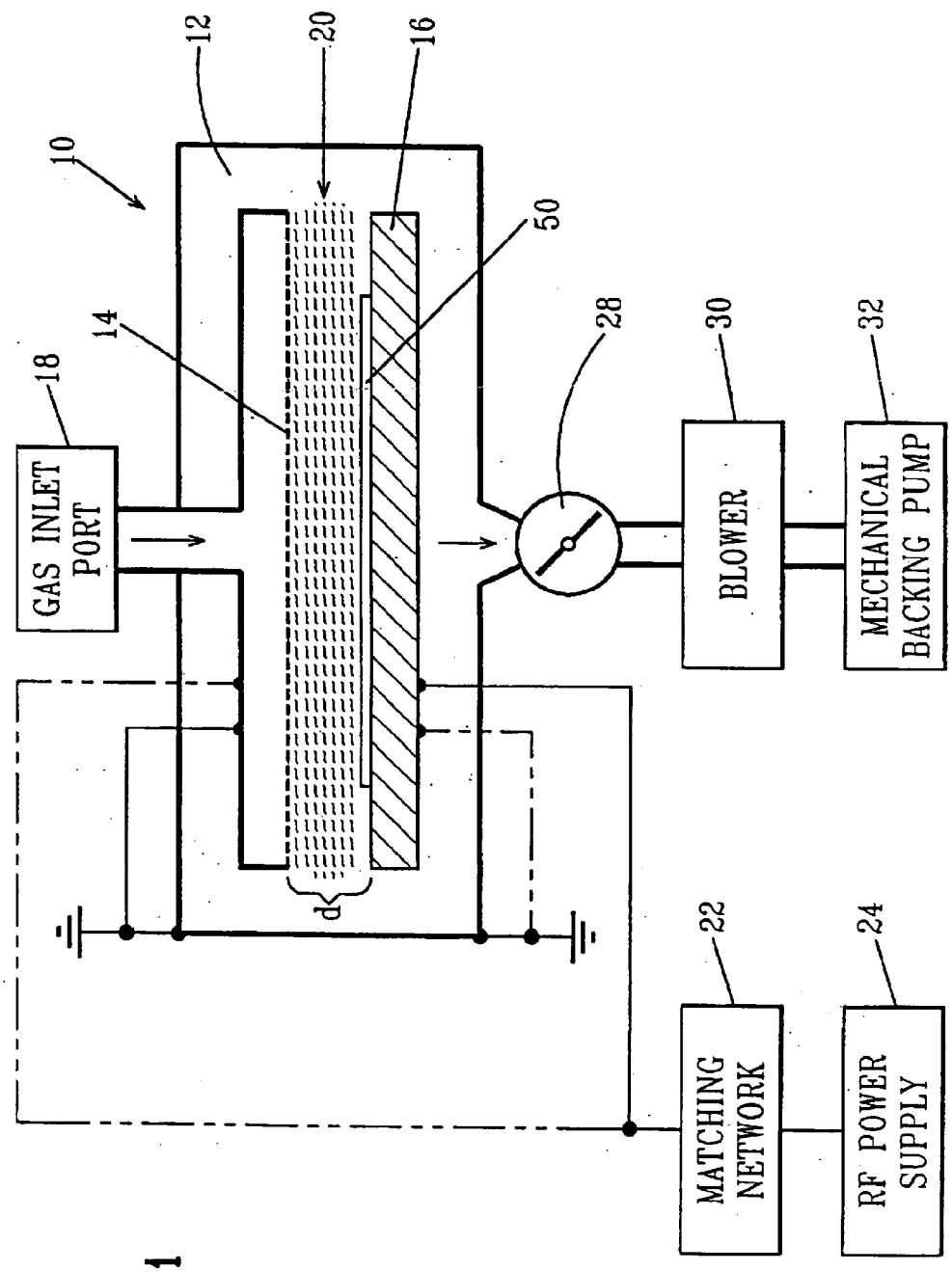
FIG. 1 is a schematic cross-sectional view of a parallel plate plasma reactor that can be employed in the present invention.

As stated above, the present invention provides a method of forming an abrasion-resistant a-GeC$_x$:H film on a surface of an IR transmissive material using a low-temperature (on the order of about 130° C. or less) plasma enhanced chemical vapor deposition process (PECVD). The term "IR transmissive material" is used herein to denote a substrate that transmits IR energy of wavelengths of from about 0.1 to about 20 microns, preferably from about 1 to about 15 microns and most preferably from about 2 to about 12 microns. Sensors or windows are said to be IR transmissive if greater than about 75% of IR transmission occurs.

Suitable IR transmissive materials (which are labeled as element 50 in the drawings of the present invention) that can be employed in the present invention include, but are not limited to: chalcogenides and other low T$_g$ (i.e., glass transition temperature) substrates. The term "chalcogenide" is used herein to denote a binary compound of a chalcogen, i.e., oxygen, sulfur, selenium, and tellurium, with a more electropositive element. Illustrative examples of chalcogenides that can be employed in the present invention include, but are not limited to: ZnS, ZnSe, GaAs, Ge$_{33}$As$_{12}$Se$_{55}$, Ge$_{28}$Sb$_{12}$Se$_{60}$, As$_2$S$_3$, and As$_y$Se$_{1-y}$ where y is greater than 0, but less than 1. A highly preferred IR transmissive material employed in the present invention is As$_y$Se$_{1-y}$.

Reference is now made to FIG. 1 which is a schematic cross-sectional view of a parallel plate plasma reactor that can be employed in the present invention. Specifically, FIG. 1 comprises parallel plate plasma reactor 10 which includes reactor chamber 12, RF power supply 24, matching network 22, gas inlet port 18, throttle valve 28, blower 30 and mechanical pump 32. The reactor chamber serves to contain the plasma during the deposition process. A RF power supply provides input power for plasma ignition and continuance, while the matching network matches the output impedance of the power supply to the input impedance of the plasma/reactor configuration. The gas inlet port is used to introduce the gas mixture into the reactor chamber. An automated throttle valve maintains the required pressure during deposition. A roots blower and mechanical backing pump are arranged in tandem to provide the necessary vacuum level to allow for low-pressure deposition.

Inside reactor chamber 12, there is top (or showerhead) electrode 14 and bottom electrode 16. IR transmissive material 50 may be positioned on either of these electrodes, with the configuration shown in FIG. 1, i.e., IR transmissive material 50 atop bottom electrode 16, being more highly preferred. In accordance with the present invention, the top electrode is separated from the bottom electrode by a distance, d, which is from about 1.00 to about 3.00 inches, with a separation distance of from about 1.25 to about 1.50 inches being more highly preferred. The showerhead electrode includes holes (represented by dotted lines in FIG. 1) which permit gas flow from gas inlet port 18 into reactor chamber 12. The gas exits the reactor chamber when throttle value 28 is switched to an open position. The arrows in the reactor chamber represent the directional flow of the gas mixture.

As shown, the showerhead electrode is coupled to ground, while bottom electrode 16 is connected to RF power source 24. In such an embodiment, the bottom electrode acquires a negative basis, whose value is dependent on the reactor geometry and plasma parameters. Alternatively, the top electrode can be connected to the RF power supply (not shown) and the bottom electrode is coupled to ground. In this alternative embodiment, the top electrode acquires the negative bias. The RF power supply can work continuously throughout the entire deposition process or it can be pulsed during the deposition process.

During operation, a region of plasma 20 comprising the gas mixture to be defined herein below is formed between the showerhead electrode and the IR transmissive material. Process variables controlled during the deposition of the inventive a-GeC$_x$:H film include RF frequency, reactant gas mixtures and flow rates, pressure in the reactor and substrate temperature. Specifically, the a-GeC$_x$:H film of the present invention is deposited using an RF frequency of from about 20 kHz to about 2.45 GHz, with an RF frequency of from about 13.56 MHz to about 2.45 GHz being more highly preferred. The pressure in the reactor at the time of deposition is from about 20 to about 600 mtorr, with a pressure of from about 85 to about 125 mtorr being more highly preferred.

Insofar as the substrate temperature is concerned, the inventive method forms the a-GeC$_x$:H film at a substrate temperature of about 130° C. or below. More preferably, the substrate temperature is maintained at a temperature of about 60° C. or below. Most preferably, the substrate temperature during the deposition of the inventive a-GeC$_x$:H film is from about 50° to about 55° C. It is noted that these low-deposition temperatures permit the formation of an a-GeC$_x$:H film that has lower intrinsic stress as compared to an equivalent film formed at higher temperatures.

The substrate temperature is maintained at the low-temperature ranges described above by using a liquid recirculator (not shown in FIG. 1) which is positioned adjacent to the reactor. It should be noted that the low-deposition temperature described above allows for low T$_g$ substrates such as As$_y$Se$_{1-y}$ to be used as an IR transmissive substrate.

The gases used in forming the a-GeC$_x$:H film include a germanium source, optionally hydrogen, and an inert gas such as He, Ne, Ar or a mixture thereof. These gases (i.e., germanium source, inert gas, and optionally hydrogen) are mixed together prior to entering the reactor chamber. Suitable germanium sources include, but are not limited to: hydrocarbon-containing germanium compounds, such as tetramethylgermanium, tetraethylgermanium, or tetrabutylgermanium; or GeH$_4$. The term "hydrocarbon" is used herein to denote a linear, branched or cyclic aliphatic compound containing 1 to about 12 carbon atoms. A highly preferred source of germanium employed in the present invention is tetramethylgermanium.

In accordance with the present invention, the gas mixture employed in the formation of the a-GeC$_x$:H film comprises, by mass flow in standard cubic centimeters per minute (sccm), from about 10 to about 35 sccm germanium source, from about 0 to about 50 sccm hydrogen, and from 75 to about 225 sccm inert gas. More preferably, the gas mixture employed in the present invention comprises from about 10 to about 20 sccm germanium source, from about 10 to about 20 sccm hydrogen, and from 150 to about 200 seem inert gas.

The deposition rate of the a-GeC$_x$:H film onto the IR transmissive material may vary depending on the conditions used to deposit the same. Typically, the deposition rate of the a-GeC$_x$:H film is from about 300 to about 800 Å/min, with a preferred deposition rate of from about 350 to about 500 Å/min.

Figure 2:
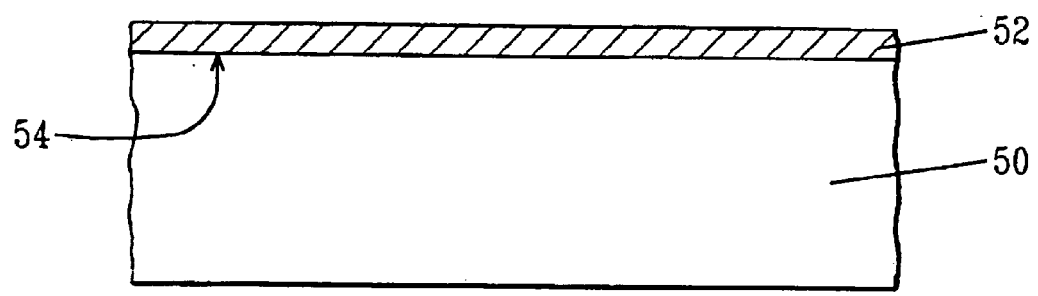
FIG. 2 is a pictorial representation (through a cross-sectional view) illustrating an IR transmissive component including an IR transmissive material and an a-GeC$_x$:H film prepared using the method of the present invention.

The resultant IR component that is formed after performing the above-mentioned low-temperature plasma deposition process is shown, for example, in FIG. 2. Specifically, the structure shown in FIG. 2 comprises IR transmissive material 50 having a-GeC$_x$:H film 52 located atop a surface thereof. As illustrated, the a-GeC$_x$:H film forms a smooth and continuous interface region 54 with the underlying IR transmissive material. The thickness of the a-GeC$_x$:H film formed in the present invention may vary depending on the exact deposition conditions employed. Typically, however, the a-GeC$_x$:H film of the present invention has a deposited thickness of from about 0.025 to about 1.500 micron, with a deposited thickness of from about 0.050 to about 1.200 micron being more highly preferred.

The a-GeC$_x$:H film of the present invention is characterized as being IR transmissive, i.e., it is capable of transmitting IR energy of wavelengths of from about 0.1 to about 20 microns, preferably from about 1 to about 15 microns and most preferably from about 2 to about 12 microns. Another characteristic feature of the inventive a-GeC$_x$:H film is that it is substantially resistant to abrasion. That is, the inventive a-GeC$_x$:H film is difficult to scratch even when abraded with steel wool. Additionally, the inventive a-GeC$_x$:H film has strong adhesive properties with the underlying IR transmissive material; hence the inventive a-GeC$_x$:H film does not delaminate from the IR transmissive material even after repeated exposure to high operation temperatures. A yet other feature of the inventive a-GeC$_x$:H film is that it is highly resistant to erosion thereby the IR transmissivity of the IR component does not significantly change over an extended period of time.

To demonstrate abrasion resistance, the a-GeC$_x$:H films were tested and passed moderate (MIL-F-48616; 4.6.8.3) and severe (MIL-F-48616; 4.6.10.1) abrasion testing. Scratch testing using steel wool indicated a greater than 500×improvement in abrasion-resistance over the preferred chalcogenide glass, that is As$_y$Se$_{1-y}$. For the scratch testing, the rms (root mean square) surface roughness was measured using an optical profilometer.

Figure 3:
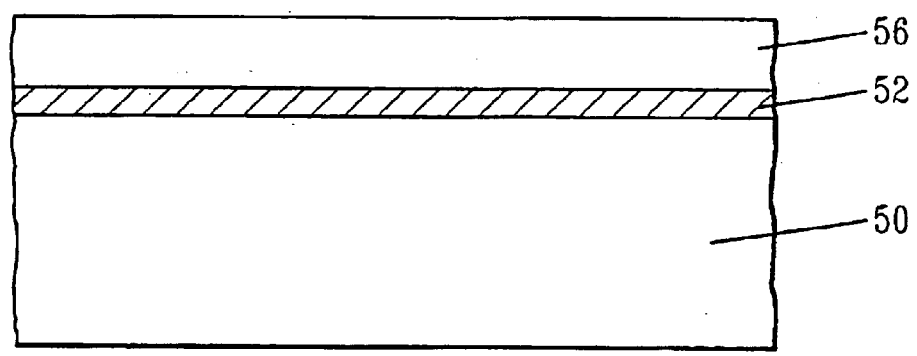
FIG. 3 is a pictorial representation (through a cross-sectional view) illustrating an IR transmissive component including an IR transmissive material, an a-GeC$_x$:H interlayer prepared using the method of the present invention, and a DLC overcoat.

FIG. 3 shows another IR component that can be formed using the inventive method of the present inventive. In this instance, the a-GeC$_x$:H film is used as an interlayer for overcoat 56. The overcoat includes any other IR transmissive, abrasion-resistant coating, including, for example, DLC. The overcoat can be formed from a commercial plasma deposition process or sputtering using conditions well known to those skilled in the art. In the embodiment shown in FIG. 3, the a-GeC$_x$:H film functions as an interlayer between the IR transmissive material and the overcoat. In this embodiment, the a-GeC$_x$:H film has strong adhesive properties with the underlying IR transmissive material as well as with the overcoat.

It should again be emphasized that the inventive low-temperature plasma deposition process enables temperature sensitive IR transmissive materials to become viable for use as optical components in IR imagining systems. The following example is given to illustrate some advantages of the inventive a-GeC$_x$:H film has as an abrasion-resistant coating for an IR transmissive material.

EXAMPLE

In this example, the abrasion-resistance of an a-GeC$_x$:H coated IR transmissive material was compared with the abrasion-resistance of uncoated IR transmissive material. The specific IR transmissive material employed in this example is As$_y$Se$_{1-y}$. The a-GeC$_x$:H coating, which had a deposited thickness of about 1.0 micron, was formed using the inventive method of the present invention using tetramethylgermanium as the germanium source material and using an RF frequency of about 13.56 MHz to generate the plasma.

Precise measurement of surface roughness using optical profilometry was employed in this example to determine the abrasion-resistance. The rms (root mean square) surface roughness (R$_q$) of the uncoated and a-GeC$_x$:H coated As$_y$Se$_{1-y}$ were measured before and after abrasion with super fine (#0000) steel wool. The uncoated As$_y$Se$_{1-y}$ prior to abrasion had a measured rms surface roughness of about 7.58 nm. After abrading with steel wool, the rms surface roughness was about 208.56 nm. In the case of the a-GeC$_x$:H coated As$_y$Se$_{1-y}$, the sample had an initial rms surface roughness of about 11.55 nm. After abrading, the a-GeC$_x$:H coated As$_y$Se$_{1-y}$ sample had an rms surface roughness of about 11.92 nm.

The above results demonstrate that the coating provides an approximate 540× improvement in abrasion-resistance relative to the uncoated IR transmissive material.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An optical transmissive component comprising:

an IR transmissive material;

a hydrogenated amorphous germanium carbon (a-GeC$_x$:H) film having a thickness from about 0.025 to about 1.500 micron located atop a surface of the IR transmissive material, wherein said a-GeC$_x$:H film is IR transmissive, is substantially resistant to abrasion, and x is a number from about 10 to about 45; and a diamond-like carbon coating located atop said a-GeC$_x$:H film.

2. The optical transmissive component of claim 1 wherein said IR transmissive material is a chalcogenide.

3. The optical transmissive component of claim 2 wherein said chalcogenide is As$_y$Se$_{1-y}$.

* * * * *